(12) United States Patent
Ootsuka et al.

(10) Patent No.: US 7,175,714 B2
(45) Date of Patent: *Feb. 13, 2007

(54) ELECTRODE-BUILT-IN SUSCEPTOR AND A MANUFACTURING METHOD THEREFOR

(75) Inventors: Takeshi Ootsuka, Funabashi (JP); Kazunori Endou, Funabashi (JP)

(73) Assignee: Sumitomo Osaka Cement Co., Ltd. (JP)

( * ) Notice: Subject to any disclaimer, the term of this patent is extended or adjusted under 35 U.S.C. 154(b) by 165 days.

This patent is subject to a terminal disclaimer.

(21) Appl. No.: 10/613,574

(22) Filed: Jul. 3, 2003

(65) Prior Publication Data

US 2004/0074606 A1    Apr. 22, 2004

(30) Foreign Application Priority Data

Jul. 5, 2002    (JP)    ............... 2002-197970

(51) Int. Cl.
*H01L 29/06* (2006.01)
*H01L 21/00* (2006.01)

(52) U.S. Cl. .............. 118/728; 438/20; 156/345.47
(58) Field of Classification Search ............ 118/723 E; 219/634; 361/234; 279/128
See application file for complete search history.

(56) References Cited

U.S. PATENT DOCUMENTS

| | | | |
|---|---|---|---|
| 5,688,331 A | | 11/1997 | Aruga et al. |
| 6,001,760 A | * | 12/1999 | Katsuda et al. ............ 501/98.4 |
| 6,134,096 A | * | 10/2000 | Yamada et al. ............ 361/234 |
| 6,444,957 B1 | * | 9/2002 | Kitagawa et al. ........ 219/444.1 |
| 6,475,924 B2 | * | 11/2002 | Yamamoto et al. ......... 438/758 |
| 6,483,690 B1 | * | 11/2002 | Nakajima et al. ........... 361/234 |
| 6,693,789 B2 | * | 2/2004 | Inazumachi et al. ........ 361/234 |
| 6,872,908 B2 | * | 3/2005 | Ootsuka et al. ........ 219/121.52 |

(Continued)

FOREIGN PATENT DOCUMENTS

JP    4-3001136    10/1992

(Continued)

OTHER PUBLICATIONS

Foreign translation of JP 2001-085505.*

(Continued)

*Primary Examiner*—Ram Kackar
*Assistant Examiner*—Sylvia R. MacArthur
(74) *Attorney, Agent, or Firm*—Ostrolenk, Faber, Gerb & Soffen, LLP

(57) ABSTRACT

An electrode-built-in susceptor comprises a mounting plate and a supporting plate which are made of an aluminium-nitride-group-sintered member, an inner electrode which is made of a conductive aluminium-nitride-tantalum-nitride-composite-sintered-member or a conductive aluminium-nitride-tungsten-composite-sintered-member so as to be formed between the mounting plate and the supporting plate, power supplying terminals 16, 16 which is disposed in fixing holes 13, 13 which are formed on the supporting plate so as to be attached to the inner electrode. The power supplying terminals are made of a conductive aluminium-nitride-tantalum-nitride-composite-sintered-member.

By doing this, it is possible to provide an electrode-built-in susceptor which has superior durability under a high temperature oxidizing atmosphere condition and a method for manufacturing an electrode-built-in susceptor with a high product yield and a low production cost.

5 Claims, 3 Drawing Sheets

U.S. PATENT DOCUMENTS

| | | | |
|---|---|---|---|
| 2002/0006678 A1* | 1/2002 | Inazumachi et al. | 438/20 |
| 2002/0023914 A1* | 2/2002 | Kitagawa et al. | 219/444.1 |
| 2003/0071260 A1* | 4/2003 | Ootsuka et al. | 257/44 |
| 2003/0089687 A1 | 5/2003 | Maki | |
| 2004/0011287 A1* | 1/2004 | Ootsuka | 118/715 |
| 2004/0074606 A1* | 4/2004 | Ootsuka et al. | 156/345.47 |

FOREIGN PATENT DOCUMENTS

| | | |
|---|---|---|
| JP | 6-151044 | 5/1994 |
| JP | 6-151332 | 5/1994 |
| JP | 7-153706 | 6/1995 |
| JP | 10-189696 | 7/1998 |
| JP | 11-162112 | 6/1999 |
| JP | 2000-332090 | 11/2000 |
| JP | 2001-085505 | 3/2001 |
| JP | 2001-287982 | 10/2001 |
| JP | 2001-308165 | 11/2001 |
| JP | 2003-124296 | 4/2003 |
| JP | 2003-152064 | 5/2003 |

OTHER PUBLICATIONS

English translation of Abstract for Japenese Patent Application No. JP-4-3001136.

English translation of Abstract for Japenese Patent Application No. JP-6-151044.

English translation of Abstract for Japenese Patent Application No. JP-6-151332.

English translation of Abstract for Japenese Patent Application No. JP-10-189696.

English translation of Abstract for Japenese Patent Application No. 2002-124296.

English translation of Abstract for Japenese Patent Application No. JP-2001-085505.

Untranslated Office Action issued by Japanese Patent Office on Oct. 18, 2005 in connection with corresponding Japanese patent application No. 2002-197970.

English translation of Office Action issued by Japanese Patent Office on Oct. 18, 2005 in connection with corresponding Japanese patent application No. 2002-197970.

* cited by examiner

ELECTRODE-BUILT-IN SUSCEPTOR AND A MANUFACTURING METHOD THEREFOR

BACKGROUND OF THE INVENTION

1. Field of the Invention

The present invention relates to an electrode-built-in susceptor and a manufacturing method therefore. In particular, the present invention relates to an electrode-built-in susceptor having a superior durability under a high temperature oxidizing atmosphere. Also, the present invention relates to method for a manufacturing an electrode-built-in susceptor with a high product yield in a low product cost.

2. Description of Related Art

In recent years, manufacturing processes such as an etching process, a coating process are performed per a wafer or per a base board uniformly in a production process for a semiconductor device such as an IC (integrated circuit), an LSI (large scale integration), VLSI (very large scale integration). It is the same for manufacturing process for a display device such as a liquid crystal display (LCD) and a plasma display (PDP) and an assembly process for a hybrid IC of the like. A sheet-by-sheet process for a plate sample such as a semiconductor device, a glass base board for a liquid crystal, and a printed circuit board is becoming more common.

In such a sheet-by-sheet process, a plate sample is supported in a processing chamber sheet by sheet, or wafer by wafer. The plate sample is mounted on a sample base which is called as a susceptor and processed for a predetermined time.

It is necessary that such a susceptor can be used under a high temperature plasma condition. Therefore, it is required that such a susceptor has a superior plasma characteristics and a larger thermal conductivity.

For such a susceptor, a susceptor which is made of a aluminium-nitride-group-sintered-member having superior high temperature anti-plasma characteristics is commonly used.

There is a case in which an electrostatic chucking electrode for fixing a plate sample by generating an electric charge and an electrostatic absorbing force is disposed in the susceptor. Also, there is a case in which a heating electrode for heating the plate sample by an electricity is disposed in the susceptor. Also, there is a case in which an inner electrode for generating a plasma by applying a high frequency electricity is disposed in the susceptor.

FIG. 5 is a cross section showing an example for an electrode-built-in susceptor in which such an inner electrode is built thereinside. An electrode-built-in susceptor (1) comprises a mounting plate 2 which is made of an aluminium-nitride-group-sintered-member of which upper surface is a mounting surface 2a on which a plate sample is mounted, a supporting plate 3 which is made of an aluminium-nitride-group-sintered-member which is attached to the mounting plate 2 unitarily, an inner electrode 4 which is disposed between the mounting plate 2 and the supporting plate 3, and power supplying terminals 6, 6 which are disposed in a fixing hole 5 in the supporting plate 3 such that the power supplying terminals 6, 6 contact the inner electrode 4.

The power supplying terminal 6 is made of a conductive aluminium-nitride-tungsten-composite-sintered-member.

Such an electrode-built-in susceptor 1 having such a structure is produced as follows. First, fixing holes 5, 5 which penetrate a supporting plate 3 which is made of a aluminium-nitride-group-sintered-member are formed in a thickness direction of the supporting plate 3. The power supplying terminals 6, 6 which are made of a conductive aluminium-nitride-tungsten-composite-sintered-member are fixed in the fixing holes 5, 5. Next, a member 7 which contains a conductive powder is applied and dried on the supporting plate 3 such that the member 7 contacts the power supplying terminals 6, 6. Consequently, the supporting plate 3 and the mounting plate 2 which is made of an aluminium-nitride-group-sintered-member are attached together via a surface of the member 7 which is applied on the supporting plate 3. Furthermore, the supporting plate 3 and the mounting plate 2 are heated under a compressed condition unitarily. Thus, the member 7 is sintered and an inner electrode 4 is formed between the supporting plate 3 and the mounting plate 2.

In the electrode-built-in susceptor 1, the power supplying terminal 6 is attached to the inner electrode 4 together reliably; therefore, a conductivity in the electrode-built-in susceptor 1 is very high.

However, in the electrode-built-in susceptor 1, an oxidization resistance in the power supplying terminal 6 is not sufficient; therefore, there is a problem in that a durability to a thermal cyclic load decreases under condition in an oxidizing atmosphere at a temperature higher than 400° C.

For such a case, it is proposed that a periphery of the power supplying terminal is cooled. When the periphery of the power supplying terminal 6 is cooled, there are other problems in that the plate sample takes more time to be heated at a predetermined temperature and that a uniform thermal disposition in the plate sample decreases.

SUMMARY OF THE INVENTION

The present invention was made in consideration of the above problems. An object of the present invention is to provide an electrode-built-in susceptor which has a superior durability under a high temperature oxidizing atmosphere condition. Another object of the present invention is to provide a method for producing an electrode-built-in susceptor according to which it is possible to realize a high product yield in a low product cost in manufacturing the electrode-built-in susceptor.

Inventors of the present invention made a lot of research and development for realizing a solution for the above problems elaborately. As a result, the inventors found that it is possible to solve the above problems efficiently by forming a power supplying terminal having a certain structure by using a conductive member; thus, the present invention was made.

That is, an electrode-built-in susceptor according to the present invention comprises a susceptor base member which is made of an aluminium-nitride-group-sintered-member on one of which surface a plate sample is mounted, an inner electrode which is built in the susceptor member, and a power supplying terminal which is disposed in the susceptor base member so as to be attached to the inner electrode. Also, in this aspect of the present invention, the power supplying terminal is made of a conductive aluminium-nitride-tantalum-nitride-composite-sintered-member.

According to the electrode-built-in susceptor according to the present invention, the power supplying terminal is formed by a conductive aluminium-nitride-tantalum-nitride-composite-sintered-member. Therefore, the power supplying terminal is attached to the inner electrode reliably; thus, the conductivity therebetween becomes quite reliable. For example, a durability is superior under condition of highly oxidizing atmosphere at a temperature higher than 500° C.

Therefore, it is not necessary to cool the periphery of the power supplying terminal. Also, there is not a concern that the temperature rises slowly when the plate sample which is mounted on the mounting plate is heated at a predetermined temperature. Also, there is not a concern in that a uniform thermal distribution decreases in the plate sample.

Here, in the present invention, it is defined that an aluminium-nitride-group-sintered-member indicates a composite-sintered-member having no less than 50 weight percent of either one of an aluminium-nitride-group-sintered-member or an aluminium-nitride.

According to the an electrode-built-in susceptor of the present invention, it is preferable that the susceptor base member is formed by a mounting plate which is made of a aluminium-nitride-group-sintered-member on one of which main surface a plate sample is mounted and a supporting plate which is made of a aluminium-nitride-group-sintered-member which is attached to the mounting plate unitarily.

By doing this, it is possible to dispose the inner electrode in a desirable position in the susceptor base body easily. Also, it is possible to connect the power supplying terminal and the inner electrode reliably; thus, it is possible to realize a more reliable conductivity.

According to the present invention, it is preferable that the inner electrode is made of a conductive aluminium-nitride-tantalum-nitride-composite-sintered-member or a conductive aluminium-nitride-tungsten-composite-sintered-member.

It is preferable that the aluminium-nitride-tantalum-nitride-composite-sintered-member contains a tantalum-nitride having 58 to 98 weight percent.

It is preferable that the aluminium-nitride-tungsten-composite-sintered-member contains a tungsten having 58 to 80 weight percent.

By controlling a composition in the aluminium-nitride-tantalum-nitride-composite-sintered-member or the aluminium-nitride-tungsten-composite-sintered-member in the above manner, it is possible to alleviate a thermal stress which is caused by a difference of coefficient of thermal expansion between the members which is used in the manufacturing processes. Also, the power supplying terminal is attached to the inner electrode reliably; thus, an electric conductivity can be improved more reliably.

Also, according to the present invention, it is characterized in that a method for manufacturing an electrode-built-in susceptor comprises the steps of making a mounting plate for mounting a plate sample thereon and a supporting plate for supporting a mounting plate by a aluminium-nitride-group-sintered-member, forming a through hole on the supporting plate, inserting a power supplying terminal which is made of a conductive aluminium-nitride-tantalum-nitride-composite-sintered-member in the through hole so as to fix the power supplying terminal therethrough, applying a member which contains a conductive powder on a main surface of the supporting plate such that the conductive powder contacts the power supplying terminal, attaching the mounting plate to the supporting plate via the member which contains the conductive powder, heating the mounting plate and the supporting plate under a compressed-atmosphere condition so as to form an inner electrode between the supporting plate and the mounting plate unitarily.

According to a method for manufacturing an electrode-built-in susceptor of the present invention, it is possible to connect the power supplying terminal to the inner electrode which is built in the susceptor base member electrically reliably. Also, an anti-oxidization characteristics is superior under a high temperature condition.

By doing this, it is possible to produce an electrode-built-in susceptor having a superior durability under a high temperature oxidizing atmosphere condition with a high product yield in a low product cost.

Also, according to the present invention, it is characterized in that a method for manufacturing an electrode-built-in susceptor comprises the steps of making a green body for a mounting plate for mounting a plate sample thereon and a green body for supporting the mounting plate by a slurry which contains an aluminium-nitride-group-powder, forming a through hole on the green body for the supporting plate, filling a aluminium-nitride-tungsten-composite-sintered-member as a power supplying terminal in the through hole, applying a member which contains a conductive powder on a main surface of the green body for the supporting plate such that the conductive powder contacts the aluminium-nitride-tungsten-composite-sintered-member, attaching the green body for the mounting plate to the green body for the supporting plate via the member which contains the conductive powder, heating the green body for the mounting plate and the green body for the supporting plate under a compressed-atmosphere condition so as to form an inner electrode between the supporting plate and the mounting plate which are made of an aluminium-nitride-group-sintered-member unitarily.

According to the above method for manufacturing a electrode-built-in susceptor, it is possible to connect the inner electrode and the power supplying terminal electrically reliably by heating the green body for the mounting plate, the green body for the supporting plate, the member for forming the inner electrode, and the aluminium-nitride-tantalum-nitride-composite-sintered-member under compressed condition in a same operation. Also, it is possible to realize a superior anti-oxidization characteristics under a high temperature condition.

By doing this, it is possible to manufacture an electrode-built-in susceptor having a superior durability under a high temperature oxidizing atmosphere condition with a high product yield in a low production cost.

As explained above, according to the electrode-built-in susceptor of the present invention, a power supplying terminal is formed by the aluminium-nitride-tantalum-nitride-composite-sintered-member; thus, an electric conductivity in the power supplying terminal is quite high because the inner electrode and the power supplying terminal are connected reliably each other. Also, durability of the power supplying terminal is superior under a high temperature oxidizing atmosphere condition; therefore, it is not necessary to cool the periphery of the power supplying terminal.

Also, according to the method for manufacturing the electrode-built-in susceptor of the present invention, it is possible to connect the power supplying terminal to the inner electrode which is built in the susceptor base member electrically reliably. Therefore, it is possible to manufacture an electrode-built-in susceptor having a superior durability under a high temperature oxidizing atmosphere condition with a high product yield in a low production cost.

Also, according to other method for manufacturing the electrode-built-in susceptor of the present invention, it is possible to connect the inner electrode and the power supplying terminal electrically reliably by heating the green body for the mounting plate, the green body for the supporting plate, the member for forming the inner electrode, and the aluminium-nitride-tantalum-nitride-composite-sintered-member under compressed condition in a same operation. Therefore, it is possible to manufacture an electrode-built-in susceptor having a superior durability under a high temperature oxidizing atmosphere condition with a high product yield in a low production cost.

DETAILED DESCRIPTION OF THE INVENTION

An electrode-built-in susceptor and a manufacturing method therefore are explained with reference to following embodiments.

Here, the following embodiments are referred so as to better explain the features of the present invention. It should be understood, however, that the drawings and detailed description thereto are not intended to limit the invention to the particular form disclosed.

First Embodiment

Figure 1:
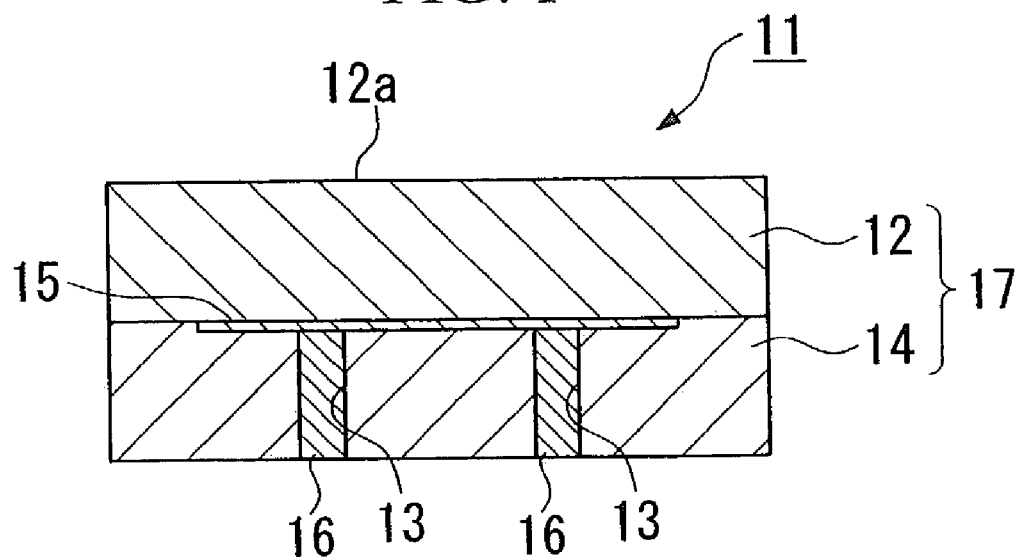
FIG. 1 is a cross section of an electrode-built-in susceptor according to a first embodiment of the present invention.
Figure 5:
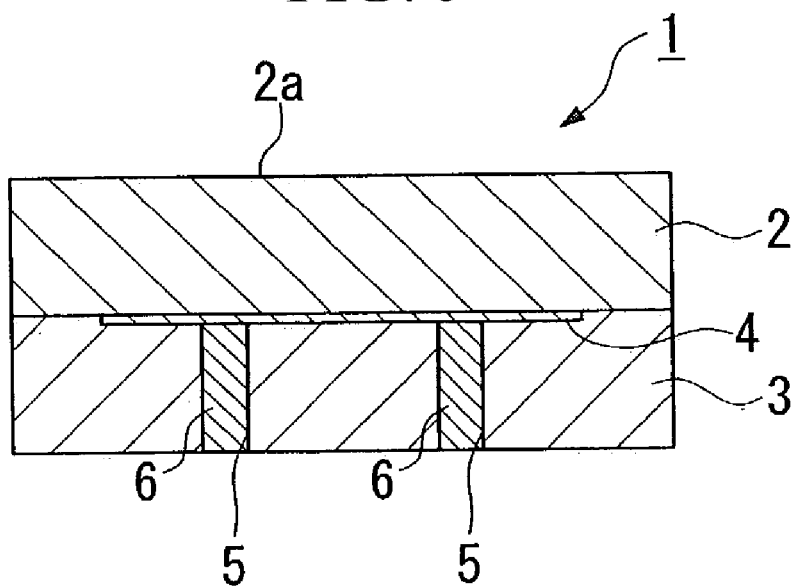
FIG. 5 is a cross section for an example of a conventional electrode-built-in susceptor.

FIG. 1 is a cross section showing an electrode-built-in susceptor according to a first embodiment of the present invention.

An electrode-built-in susceptor 11 comprises a mounting plate 12 one of which upper surface (a main surface) surface is a mounting surface 12*a* on which a plate sample such as semiconductor wafer, a glass base board for a liquid crystal. and a printed circuit board is mounted, a supporting plate 14 which is attached to the mounting plate 12 unitarily and has fixing holes (through holes) 13, 13 formed in a thickness direction on predetermined positions, an inner electrode 15 which is disposed unitarily between the mounting plate 12 and the supporting plate 14, and power supplying terminals 16, 16 which are disposed in the fixing holes 13, 13 on the supporting plate 14 so as to be attached to the inner electrode 15.

These mounting plate 12 and the supporting plate 14 are formed unitarily via the inner electrode 15 so as to form the susceptor base member 17.

The mounting plate 12 and the supporting plate 14 have the same shape when the mounting plate 12 and the supporting plate 14 are attached together. Also, mounting plate 12 and the supporting plate 14 are made of an aluminium-nitride (AlN)-group-sintered-member. The aluminium-nitride-group-sintered-member is not limited to a specific material. For example, a member which contains at least 50 weight % of aluminium-nitride can be used preferably. For such an aluminium-nitride-group-sintered-member for improving a sintering characteristics and an anti-plasma characteristics, it is possible to name an aluminium-nitride-group-sintered-member which contains at least one of material selected among yttrium oxide ($Y_2O_3$), lanthanum oxide ($La_2O_3$), calcium oxide (CaO), magnesium oxide (MgO), silicon carbide (SiC), and titanium oxide ($TiO_2$) such that the weight % in the aluminium-nitride-group-sintered-member is 0.1 to 10.0 weight %. Also, it is possible to name an aluminium-nitride-silicon-carbide-composite-sintered-member which contains the silicon carbide such that the weight % of the silicon carbide in the aluminium-nitride-silicon-carbide-composite-sintered-member is not more than 50 weight %.

The inner electrode 15 can be used for an electrostatic chucking electrode for fixing the plate sample by using an electrostatic absorbing force which is caused by generating an electric charge, a heater electrode for heating the plate sample by a heat which is generated by an electricity, and a plasma-generating-electrode for generating a plasma for performing a plasma processing by flowing a high frequency electricity. It is possible to change the size and shape of the inner electrode 15 preferably according to a purpose.

There is not a particular limit for which material forms the inner electrode 15. For example, it is possible to use a conductive aluminium-nitride-tantalum-nitride-composite-sintered-member or a conductive aluminium-nitride-tungsten-composite-sintered-member preferably.

For the above aluminium-nitride-tantalum-nitride-composite-sintered-member, it is preferable that a tantalum-nitride is contained in the aluminium-nitride-tungsten-composite-sintered-member by 50 to 98 weight % and the rest of the weight % is formed by an aluminium-nitride. Here, a tantalum-nitride is contained in the aluminium-nitride-tungsten-composite-sintered-member by 50 to 98 weight % because an inner electrode 15 does not work properly if the weight % is lower than 50 weight %; thus a resistance in the inner electrode 15 increases. Also, If the weight % of the tantalum-nitride in the aluminium-nitride-tungsten-composite-sintered-member exceeds 98 weight %, a coefficient of thermal expansion in the inner electrode 15 becomes different from that in the aluminium-nitride-group-sintered-member which forms the mounting plate 12 and the supporting plate 14. Therefore, there is a concern that a thermal stress destruction may occur in a heating process under compressed condition thereafter.

For the above aluminium-nitride-tungsten-composite-sintered-member, it is preferable that a tungsten is contained in the aluminium-nitride-tungsten-composite-sintered-member by 58 to 80 weight % and the rest of the weight % is formed by an aluminium-nitride. Here, a tungsten is contained in the aluminium-nitride-tungsten-composite-sintered-member by 58 to 80 weight % is because an inner electrode 15 does not work properly if the weight % is lower than 58 weight %; thus a resistance in the inner electrode 15 increases. Also, If the weight % of the tungsten in the aluminium-nitride-tungsten-composite-sintered-member exceeds 80 weight %, a coefficient of thermal expansion in the inner electrode 15 becomes different from that in the aluminium-nitride-group-sintered-member which forms the mounting plate 12 and the supporting plate 14. Therefore, there is a concern that a thermal stress destruction may occur in a heating process under compressed condition thereafter.

The power supplying terminals 16, 16 are disposed so as to supply an electricity to the inner electrode 15 from thereoutside. The quantity, shape, and disposition of the power supplying terminals 16, 16 are determined according to which purpose the power supplying terminals 16, 16 are used such as an electrostatic chucking electrode, a heater electrode, or a plasma generating electrode.

These power supplying terminals 16, 16 are attached to the above inner electrode 15. The power supplying terminals 16, 16 are formed by a conductive aluminium-nitride-tantalum-nitride-composite-sintered-member. Therefore, the durability of the electrode-built-in susceptor 11 is superior under condition of high temperature oxidizing atmosphere condition.

These power supplying terminals 16, 16 are made of a conductive aluminium-nitride-tantalum-nitride-composite-sintered-member which is obtained by heating a mixture of the powder of an aluminium-nitride and a tantalum-nitride under a compressed condition. Here, it is preferable that 50 to 98 weight % of the tantalum-nitride powder is contained in the obtained aluminium-nitride-tantalum-nitride-composite-sintered-member.

By controlling a composition in the aluminium-nitride-tantalum-nitride-composite-sintered-member in the above manner, it is possible to alleviate a thermal stress which is caused by a difference of coefficient of thermal expansion between the members which is used in the processes for manufacturing the susceptor. By doing this, the power supplying terminal 16 is connected to the inner electrode 15 reliably; thus, the electric conductivity can be further improved.

It is preferable that these power supplying terminals 16, 16 are formed in a columnar shape having 2 to 10 mm of diameter. That is because the power supplying terminals 16, 16 do not have sufficient resistance if a diameter of the power supplying terminal is smaller than 2 mm. In addition, in such a case, there is unfavorably a concern that a heat is generated when an electricity is applied. Also, there is a concern that the power supplying terminal 16 and/or the supporting plate 14 may unfavorably be broken due to a difference of a coefficient of thermal stress between the supporting plate 14 and the power supplying terminal 16 if a diameter of the power supplying terminal 16 exceeds 10 mm.

Next, a method for manufacturing an electrode-built-in susceptor according to the present embodiment is explained with reference to FIGS. 2A to 3B.

Figure 2A:
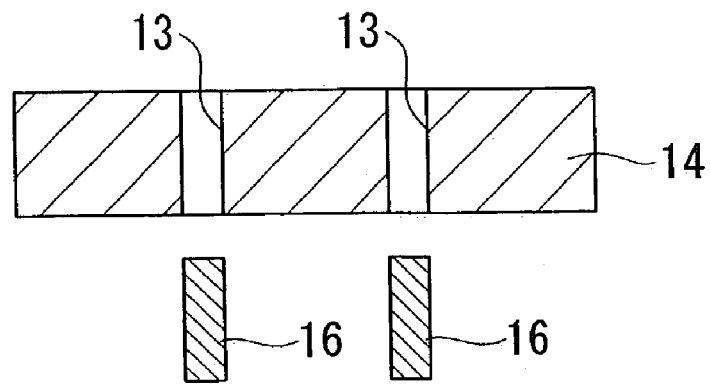
FIGS. 2A to 2C show processes in a manufacturing method for an electrode-built-in susceptor according to a first embodiment of the present invention.

First, as shown in FIG. 2A, fixing holes (through holes) 13, 13 for holding power supplying terminals 16, 16 are formed on the supporting plate 14 which is made of circular plate made of an aluminium-nitride-group-sintered-member. There is not a limit for a method for forming the fixing holes 13, 13 in particular. For example, various methods can be employed such as a method in which a diamond drill is used, a method using a laser, an electric discharging method, and a method using a supersonic wave. Here, the fixing hole can be acceptable as long as an ordinary accuracy is obtained under condition that the product yield is approximately 100%. Here, the position and quantity of the fixing holes 13, 13 are determined by factors in the inner electrode 15 such as the shape, disposition, and quantity of the inner electrode 15.

Next, the power supplying terminals 16, 16 are produced so as to in such size and shape that the power supplying terminals 16, 16 can be attached and fixed closely in the fixing hole 13 made on the supporting plate 14.

Such a power supplying terminal 16 can be produced by mixing an aluminium-nitride powder and a tantalum-nitride powder and heating the mixture of the aluminium-nitride powder and the tantalum-nitride powder under a compressed condition.

It is preferable the ratio of weight % of the tantalum-nitride power is, for example, 50 to 98 weight % and the rest of the weight % is that of the aluminium-nitride powder.

Here, the ratio of weight % of the tantalum-nitride power is, for example, 50 to 98 weight % and the rest of the weight % is that of the aluminium-nitride powder because a resistance in the power supplying terminal 16 increases; thus, the power supplying terminal 16 does not work properly if the weight % of the tantalum-nitride is lower than 50 weight %. Also, if weight % of the tantalum-nitride exceeds 98 weight %, a coefficient of thermal expansion in the power supplying terminal 16 becomes different from that in the aluminium-nitride-group-sintered-member which forms the mounting plate 12 and the supporting plate 14 greatly. Therefore, there is a concern that a thermal stress destruction may occur in a heating process under compressed condition thereafter.

The power supplying terminal 16 is deformed thermally in a heating process thereafter under a compressed condition so as to be fixed in the fixing hole 13. It is acceptable if the power supplying terminal is formed with in a standard tolerance which is according to Japan Industrial Standard (JIS)fixing hole.

Figure 2B:
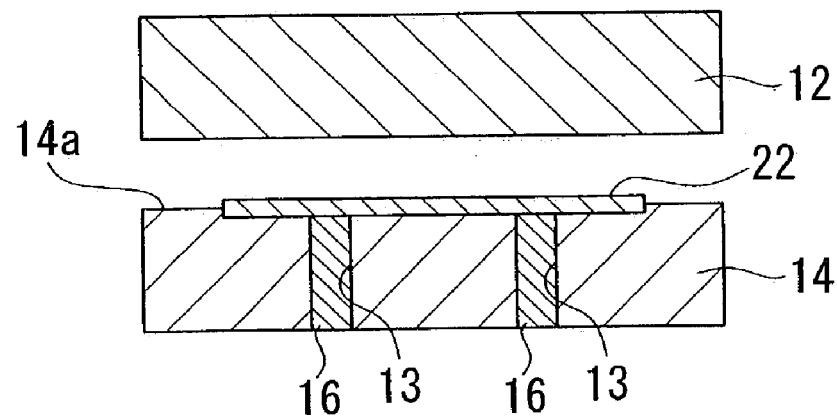

Next, as shown in FIG. 2B, the power supplying terminals 16, 16 are fitted in the fixing holes 13, 13 which are formed on the supporting plate 14.

Next, an inner electrode forming layer 23 is formed by applying a conductive power such as a conductive aluminium-nitride-tantalum-nitride-composite-sintered-member or a member 22 for forming an inner electrode which is made of an organic solvent such as an ethyl alcohol in which a conductive aluminium-nitride-tungsten-composite-sintered-member is dispersed in a predetermined area on a surface (a main surface) of the supporting plate 14 such that the aluminium-nitride-tantalum-nitride-composite-sintered-member and the member 22 contact the power supplying terminals 16, 16 and drying the supporting plate 14.

For a method for applying the member 22 for forming an inner electrode, it is preferable to use a screen printing method or the like because it is necessary to apply the member 22 for forming an inner electrode in a uniform thickness.

For the above aluminium-nitride-tantalum-nitride-composite-sintered-member, it is preferable to use a mixture of the aluminium-nitride powder and the tantalum-nitride powder such that the weight % of the tantalum-nitride powder is 50 to 98%.

Thus, the weight % of the tantalum-nitride powder is limited in above manner because a resistance in the inner electrode 15 increases; thus, the inner electrode 15 does not work properly if the weight % of the tantalum-nitride powder is lower than 50 weight %. Also, if weight % of the tantalum-nitride powder exceeds 98 weight %, a coefficient of thermal expansion in the inner electrode 15 becomes different from that in the aluminium-0nitride-group-sintered-member which forms the mounting plate 12 and the supporting plate 14 greatly. Therefore, there is a concern that a thermal stress destruction may occur in a heating process under compressed condition thereafter.

For the above aluminium-nitride-tungsten-composite-sintered-member, it is preferable to use a mixture of the aluminium-nitride powder and the tantalum-nitride powder such that the weight % of the tungsten-nitride powder is 58 to 80%.

Thus, the weight % of the tungsten-nitride powder is limited in above manner because a resistance in the inner electrode 15 increases; thus, the inner electrode 15 does not work properly if the weight % of the tungsten-nitride powder is lower than 58 weight %. Also, if weight % of the tungsten-nitride powder exceeds 80 weight %, a coefficient of thermal expansion in the inner electrode 15 becomes different from that in the aluminium-nitride-group-sintered-member which forms the mounting plate 12 and the supporting plate 14 greatly. Therefore, there is a concern that a thermal stress destruction may occur in a heating process under compressed condition thereafter.

Figure 2C:
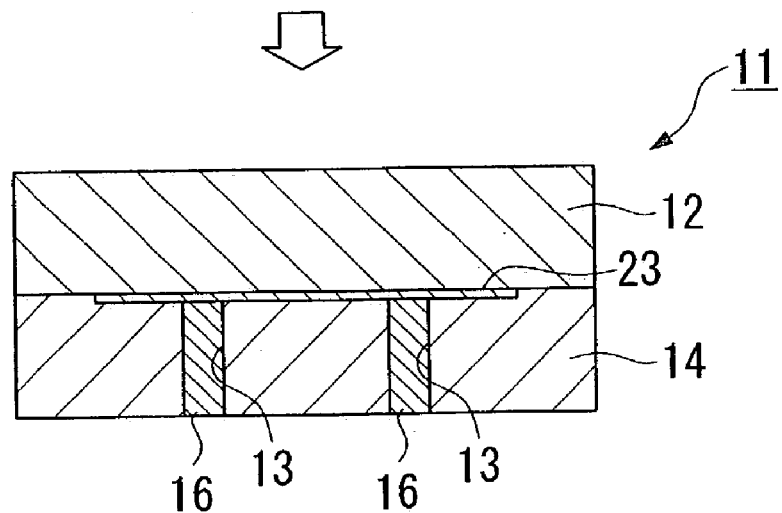

Next, the mounting plate 12 is attached so as to overlap on the supporting plate 14 on which a layer 23 for forming the inner electrode is formed. After that, the supporting plate 14 is heated unitarily under a compressed condition as shown in FIG. 2C.

As explained above, according to such a method, it is possible to attach the mounting plate 12 to the supporting plate 14 unitarily by heating the mounting plate 12 and the supporting plate 14 under a compressed condition without disposing a member for cementing the mounting plate 12 and the supporting plate 14 therebetween.

For a heating condition here, an inert atmosphere condition is preferable such as a vacuum atmosphere, Ar atmosphere, He atmosphere, $N_2$ atmosphere. In particular, an $N_2$ atmosphere is preferable so as to prevent the aluminium-nitride from solving. For an atmosphere compression condition, 5 to 10 MPa of compression condition is preferable. Also, it is preferable to perform a heating operation at 1600 to 1850° C.

Figure 3A:
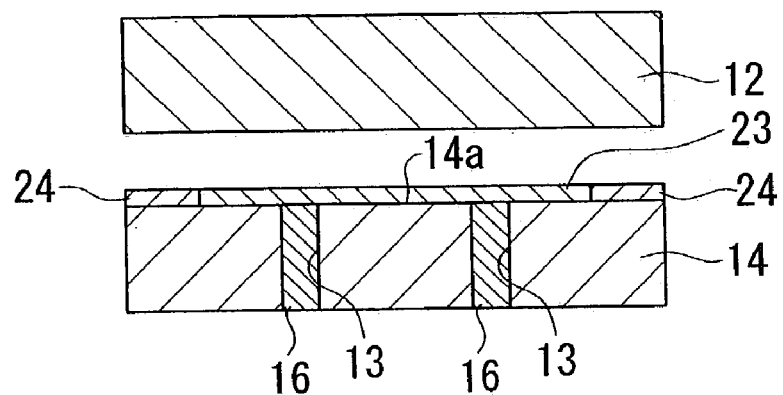
FIGS. 3A and 3B show a modified example of processes in a manufacturing method for an electrode-built-in susceptor according to a first embodiment of the present invention.

It is also acceptable if an insulating layer 24 which contains an aluminium-nitride is formed not in the layer 23 for forming the inner electrode but in the rest of the area on the surface 14a on the supporting plate 14 as shown in FIG. 3A so as to improve insulating characteristics, an anti-corrosion characteristics, and an anti-plasma characteristics in processes for attaching the supporting plate 14 and the mounting plate 12. The insulating layer 24 can be formed, for example, by applying a member which is made of an organic solvent such as an ethyl alcohol in which an aluminium-nitride powder is dispersed on a predetermined position on the surface 14a of the supporting plate 14 according to a method such as a screen printing method and the like, and heating the surface 14a of the supporting plate 14.

By performing the above heating process, the layer 23 for forming the inner electrode which is formed on the supporting plate 14 becomes the inner electrode 15 which is made of an aluminium-nitride-tantalum-nitride-composite-sintered-member which is made by heating a conductive mixture of the aluminium-nitride powder and the tantalum-nitride powder or an aluminium-nitride-tungsten-composite-sintered-member which is made by heating a conductive mixture of the aluminium-nitride powder and the tungsten powder.

Figure 3B:
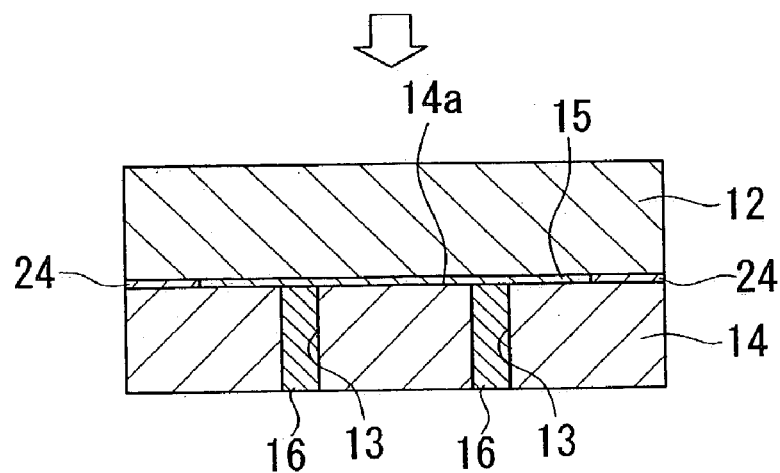

Furthermore, as shown in FIG. 3B, the insulating layer 24 which contains the aluminium-nitride is formed not in the layer 23 for forming the inner electrode but on the rest of the surface 14a of the supporting plate 14. Thus, the insulating layer 24 made of an aluminium-nitride-group-sintered-member is formed around the inner electrode 15 by heating the layer 23 for forming the inner electrode. Therefore, insulating characteristics, an anti-corrosion characteristics, and an anti-plasma characteristics can be further improved.

As explained above, a method for manufacturing an electrode-built-in susceptor was described in which a mounting plate 12 which is made of an aluminium-nitride-group-sintered-member and a supporting plate so as to attach the mounting plate and a supporting plate unitarily by a heating process under a compressed condition. More importantly, any method is acceptable as long as the mounting plate 12 and the supporting plate 14 are attached together unitarily via the inner electrode 15 by in a heating process under a compressed condition; thus, there is not a limitation to a method for producing the electrode-built-in susceptor according to the present invention.

For an example for other method for producing the electrode-built-in susceptor according to the present invention than the above method, it is possible to propose a method in which a plate green body which becomes a mounting plate and a supporting plate after the heating operation is produced from a slurry which contains an aluminium-nitride group powder, these green bodies are attached together via the layer for forming the inner electrode and heated so as to obtain an electrode-built-in susceptor.

In such a method, it is possible to use a pre-sintered power supplying terminal. Also, it is possible to use a green body which becomes a power supplying terminal after the sintering operation. The rest of the manufacturing condition is according to a case in which a pre-sintered member is used.

Also, any aluminium-nitride group powder can be used as long as the aluminium-nitride group powder contains 50 weight % of aluminium-nitride. Therefore, there is not a limit to the aluminium-nitride group powder which is used in the present invention.

For such an aluminium-nitride-group powder for improving a sintering characteristics and an anti-plasma characteristics, it is possible to name an aluminium-nitride-group powder which contains at least one of material selected among yttrium oxide ($Y_2O_3$), lanthanum oxide ($La_2O_3$), calcium oxide (CaO), magnesium oxide (MgO), silicon carbide (SiC), and titanium oxide ($TiO_2$) such that the weight % in the aluminium-nitride-group-sintered-member is 0.1 to 10.0 weight %. Also, it is possible to name an aluminium-nitride-silicon-carbide-composite-sintered-member which contains the silicon carbide such that the weight % of the silicon carbide in the aluminium-nitride-silicon-carbide-composite-sintered-member is not more than 50 weight %.

As explained above, in an electrode-built-in susceptor according to the present invention, the power supplying terminals 16, 16 are formed by a conductive aluminium-nitride-tantalum-nitride-composite-sintered-memberthus, it is possible to attach the power supplying terminals 16, 16 to the inner electrode 15 reliably. Also, the electric conductivity in the electrode-built-in susceptor becomes quite high. As a result, it is possible to realize an electrode-built-in susceptor which has a superior durability under a high temperature oxidizing atmosphere condition.

Also, according to a method for manufacturing an electrode-built-in susceptor according to the present embodiment, it is possible to manufacture an electrode-built-in susceptor 11 with a high product yield and low production cost without any extra manufacturing processes thereafter by forming fixing holes 13; 13 on a supporting plate 14 which is made of an aluminium-nitride-group-sintered-member such that the fixing holes 13, 13 penetrate therethrough in a thickness direction, putting the power supplying terminals 16, 16 through the fixing holes 13, 13, attaching the supporting plate 14 and the mounting plate 12 together via a layer for forming an inner electrode, and heating the supporting plate 14 and the mounting plate 12 under a compressed condition.

Also, it is possible to connect the inner electrode 15 and the power supplying terminal 16 reliably.

Furthermore, it is possible to reduce a difference of a coefficient of thermal expansion and Young's modulus between the mounting plate 12 and the supporting plate 14 if a member which contains a tantalum-nitride by 50 to 98 weight % is used for a conductive aluminium-nitride-tantalum-nitride-composite-sintered-member, or a member which contains a tungsten by 58 to 80 weight % is used for a conductive aluminium-nitride-tungsten-composite-sintered-member. Therefore, there is not a concern that the electrode-built-in susceptor 11 may be destructed due to the thermal stress because of difference of a coefficient of thermal expansion and Young's modulus between the mounting plate 12 and the supporting plate 14.

By doing this, it is possible to manufacture an electrode-built-in susceptor 11 which can apply an electric charge to the inner electrode 15 reliably with a high production yield and low production cost.

Second Embodiment

Figure 4:
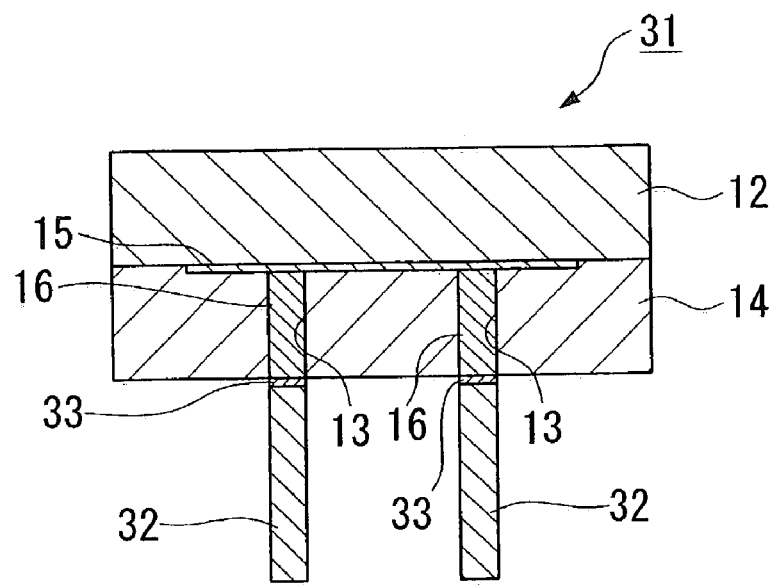
FIG. 4 is a cross section of an electrode-built-in susceptor according to a second embodiment of the present invention.

FIG. 4 is a cross section showing an electrode-built-in susceptor according to a second embodiment of the present invention. A electrode-built-in susceptor 31 according to the second embodiment of the present invention differs from the electrode-built-in susceptor 11 according to the first embodiment of the present invention in that end surfaces of the power supplying terminals 16, 16 are exposed toward thereoutside in the electrode-built-in susceptor 11 according to the first embodiment, and in contrast, protruding electrodes 32, 32 which are made of a conductive cobalt alloy are attached to the end surfaces of the power supplying terminals 16, 16 via an soldering layers 33, 33 which contain an Au-containing-solder in the electrode-built-in susceptor 31 so as to apply an electric charge to the inner electrode 15 according to the second embodiment.

When the protruding electrodes 32, 32 are attached to the end surfaces of the power supplying terminals 16, 16 respectively by using a soldering layers 33, 33 which contain an Au-containing-solder, an anti-oxidization characteristics and an anti-corrosion characteristics can be improved greatly. Therefore, a contacting portion between the power supplying terminals 16, 16 and the protruding electrodes 32, 32 is not necessary to be sealed. Also, it is not necessary to protect such a sealed section by flowing a purge gas. Thus, it is possible to use the electrode-built-in susceptor under a high temperature oxidizing atmosphere without any particular protection around the power supplying terminals 16, 16. Also, it is preferable that the contacting portion does not contain any contaminating ingredient which contaminates the plate sample which is supposed to be heated.

EXAMPLE

The present invention is described in more detail with reference to following examples.

Example 1

Producing a Power Supplying Terminal 30 weight part of an aluminium-nitride powder (average grain diameter: 0.6 m, product of Tokuyama Corp.), 70 weight part of a tantalum-nitride powder (average grain diameter: 3.4 m, product of Nihon New Metals Co., Ltd.), and 100 weight part of isopropyl alcohol are mixed. Furthermore, the mixture is dispersed uniformly by using a planetary ball mill; thus, a slurry is obtained.

Alcohol portion is removed from the slurry by a method of absorption filtering operation and the slurry is dried. Thus, an aluminium-nitride-tantalum-nitride-composite-sintered-member is obtained.

Consequently, the aluminium-nitride-tantalum-nitride-composite-sintered-powder is put in a mold and sintered. Thus, a conductive columnar aluminium-nitride-tantalum-nitride-composite-sintered-member having 2.5 mm diameter and 5.0 mm length is obtained so as to be used as a power supplying terminal 16. Here, a sintering operation is according to a compressing sintering method by using a hot-press apparatus. Conditions for the sintering operation are such as 1750° C. of sintering temperature and 20 MPa compressing force. Here, a relative density of the sintered aluminium-nitride-tantalum-nitride-composite-sintered-member is 99% or higher.

Producing a Supporting Plate 97 weight part of the above aluminium-nitride powder, 1.4 weight part of a yttrium oxide powder (average grain diameter: 1.4 m, product of Nihon Yttrium Co., Ltd.), and 100 weight part of isopropyl alcohol are mixed. Furthermore, the mixture is dispersed uniformly by using a planetary ball mill; thus, an aluminium-nitride group powder is obtained from the slurry according to a method which is employed in the above paragraphs "Producing a power supplying terminal". After that, the aluminium-nitride-group powder is put in a mold and sintered. Thus, a cirlular aluminium-nitride-group-sintered-member having 230 mm diameter and 5.0 mm thickness is obtained. Here, a sintering operation is the same as that employed in paragraphs "Producing a power supplying terminal". Consequently, the fixing holes 13, 13 which the power supplying terminals 16, 16 are put through and fixed are formed on the aluminium-nitride-group-sintered-member according to a method for making holes by a diamond drill; thus, a supporting plate 14 which is made of an aluminium-nitride-group-sintered-member is obtained.

Producing a Mounting Plate

A circular aluminium-nitride-group-sintered-member having 230 mm diameter and 5 mm thickness is obtained according to a method described in the above paragraphs "Producing a supporting plate". Next, a main surface (a surface for mounting a plate sample thereon) of the circular aluminium-nitride-group-sintered-member is polished such that a surface finish is as fine as 10 m flatness; thus a mounting plate 12 which is made of a aluminium-nitride-group-sintered-member is obtained.

Unitary Attaching Operation

As shown in FIG. 3A, the power supplying terminals 16, 16 which are formed according to the above method are pushed in the fixing holes 13, 13 which are formed on the above supporting plate 14 so as to be fixed there. Next, the member 22 for forming the inner electrode which is made of an aluminium-nitride-tantalum-nitride-composite-sintered-member which contains 28 weight % of the aluminium-nitride powder and 72 weight % of the tantalum-nitride powder is applied on the supporting plate 14 which the power supplying terminals 16, 16 are put through and fixed there so as to form an inner electrode 15 in a heating operation under a compressed condition thereafter according to a screen printing method. The member 22 is dried; thus, a layer 23 for forming an inner electrode is obtained.

Furthermore, an applying liquid which is made of 70 weight % of the aluminium-nitride-group-powder and 30 weight % of ethyl alcohol is applied not on the layer 23 for forming the inner electrode but on the rest of the surface of the supporting plate 14 according to a screen printing method. The supporting plate 14 is dried; thus, an insulating layer 24 is formed.

Next, as shown in FIG. 3B, the supporting plate 14 and the mounting plate 12 are attached such that the attached plates 12 and 14 sandwich the layer 23 for forming the inner electrode and the insulating layer 24, and a polished surface of the mounting plate 12 is disposed upwardly. The attached plates 12 and 14 are heated by a hot press under a compressed condition. Thus, an electrode-built-in susceptor according to the first embodiment is produced. The heating conditions are such as 1700° C. temperature and 7.5 MPa of compressing force.

Attaching a Protruding Electrodes

Protruding electrodes 32, 32 which are made of a conductive columnar cobalt alloy having 2.5 mm diameter and 20 mm length shown in FIG. 4 are attached to the end surfaces of the power supplying terminals 16, 16 via the soldering layers 33, 33 which contain an Au-containing-solder.

A method for attaching the protruding electrodes 32, 32 is as follows.

8.0 g of Au powder, 1.0 g of palladium powder, 1.0 g of nickel powder, 0.2 g of titanium powder, and 3.0 g of -terpineol are mixed so as to be an attaching agent.

Next, the attaching agent is applied on an end surface of the power supplying terminal 16. The power supplying terminals 16, 16 and protruding electrodes 32, 32 are assembled together via the attaching agent by using a fixture. After that, the assembled supplying terminals 16, 16 and the protruding electrodes 32, 32 are put in a degreasing apparatus so as to be degreased for thirty minutes at 120° C. temperature. Next, the degreased supplying terminals 16, 16 and the protruding electrodes 32, 32 are heated for ten minutes at 1150° C. temperature under a vacuum atmosphere condition. By doing this, the supplying terminals 16, 16 and the protruding electrodes 32, 32 are attached together via a soldering layer 33 which contains an Au-containing-soldering-member.

Example 2

A green member which is supposed to be a power supplying terminal, a supporting plate, and a mounting plate after a sintering process is produced according to the above example 1 by using a commonly-known technique. Also, a green member which is supposed to be a power supplying terminal assembled and fixed in a fixing hole which is formed on a green body which is supposed to be a supporting plate.

Next, an layer 23 for forming an inner electrode and an insulating layer 24 are formed on a green body which is supposed to be a supporting plate according to the above example 1. The green body which is supposed to be a supporting plate and the green body which is supposed to be a mounting plate are attached via the layer 23 for forming an inner electrode and the insulating layer 24. The green body which is supposed to be a supporting plate and the green body which is supposed to be a mounting plate are sintered by a hot press under a compressed condition so as to obtain a sintered member which is made of a green body. Simultaneously, the sintered members are attached unitarily; thus, an electrode-built-in susceptor according the example 2 is obtained.

Example 3

An electrode-built-in susceptor for a third example is obtained according to a method described in the above example 1. Here, a member to be applied by a screen printing method which is made of an aluminium-nitride-tungsten-composite-sintered-member containing 28 weight % of an aluminium-nitride powder and 72 weight % of a tungsten powder which becomes an inner electrode 16 in a heating process under a compressed condition thereafter is applied on a supporting plate 14 in which power supplying terminals 16, 16 are assembled to be fixed therein. The supporting plate 14 is dried; thus, a layer 23 for forming an inner electrode is formed.

Evaluation

Cross sections of the electrode-built-in susceptors in the above examples 1 to 3 are observed by a scanning-electron-microscope (hereinafter called as an SEM). As a result, it is confirmed that the mounting plate 12, a supporting plate 14, and a power supplying terminal 16 are attached together preferably.

Also, any cracking is not observed in the mounting plate 12, a supporting plate 14, and a power supplying terminal 16 respectively. Also, it is not observed that an inner electrode 15 is removed thereoff. Also, an electric conductivity between the power supplying terminals 16, 16 and the inner electrode 15 is desirable; thus, it is confirmed that the power supplying terminals 16, 16 and the inner electrode 15 are connected electrically reliably.

Also, an electricity is applied to an inner electrode 15 in the electrode-built-in susceptors obtained in the examples 1 to 3 via the protruding electrode 32 and the power supplying terminal 16. The temperature in the electrode-built-in susceptors is raised to a predetermined temperature (500° C.) by a heating speed such as 20° C./min. under an ordinary atmosphere condition. Consequently, the temperature (500° C.) is maintained for ten hours. After that, the temperature is cooled down to a room temperature (25° C.). Such a thermal load cycle is repeated 300 times. As a result, any cracking is not observed in the electrode-built-in susceptor in any temperature condition; thus, it is confirmed that the durability of the electrode-built-in susceptor is superior under hith temperature oxidizing condition. It is observed that the mounting plate 12, a supporting plate 14, and a power supplying terminal 16 are attached together preferably.

Comparison Example

An electrode-built-in susceptor is manufactured according to a method which is described in the above example 1. Here, the power supplying terminals 16, 16 are made of a conductive aluminium-nitride-tungsten-composite-sintered-member. Here, the aluminium-nitride-tungsten-composite-sintered-member is made by performing a hot press operation to a mixture of 28 weight % of an aluminium-nitride powder and 72 weight % of tungsten powder under condition of 1750° C. and 20 Mpa compression.

A cross section of an electrode-built-in susceptor which is manufactured for a comparison example is observed by an SEM. Any cracking is not observed in the mounting plate 12, a supporting plate 14, and a power supplying terminal 16 respectively. Also, it is not observed that an inner electrode 15 is removed thereoff. Also, an electric conductivity between the power supplying terminals 16, 16 and the inner electrode 15 is desirable; thus, it is confirmed that the power supplying terminals 16, 16 and the inner electrode 15 are connected electrically reliably.

A thermal cycle load which is the same as the above examples 1 to 3 are repeated seven times to the electrode-built-in susceptor for the comparison example. As a result, the power supplying terminals 16, 16 are oxidized; thus, the electrode-built-in susceptor is broken.

What is claimed is:

1. An electrode-built-in susceptor comprising:
a susceptor base member which is made of an aluminum-nitride-group-sintered-member on one surface of which a plate sample is mounted;
an inner electrode which is built in the susceptor base member; and
a power supplying terminal which is disposed in the susceptor base member so as to be attached to the inner electrode, wherein
the power supplying terminal is made of a conductive aluminum-nitride-tantalum-nitride-composite-sintered-member containing 50 to 98 weight percent of tantalum-nitride.

2. An electrode-built-in susceptor according to claim 1 wherein the susceptor base member is formed by a mounting plate which is made of an aluminum-nitride-group-sintered-member on one of which main surface a plate sample is mounted and a supporting plate which is made of an aluminum-nitride-group-sintered-member which is attached to the mounting plate unitarily.

3. An electrode-built-in susceptor according to claim 1 wherein the inner electrode is made of a conductive aluminum-nitride-tantalum-nitride-composite-sintered-member containing 50 to 98 weight percent of tantalum nitride or a conductive aluminum-nitride-tungsten-composite-sintered-member containing 58 to 80 weight percent of tungsten.

4. A method for manufacturing an electrode-built-in susceptor comprising:
making a mounting plate for mounting a plate sample thereon and a supporting plate for supporting the mounting plate by an aluminum-nitride-group-sintered-member;
forming a through hole on the supporting plate;
inserting a power supplying terminal which is made of a conductive aluminum-nitride-tantalum-nitride-composite-sintered-member containing 50 to 98 weight percent of tantalum nitride in the through hole so as to fix the power supplying terminal therethrough;
applying a member which contains a conductive powder on a main surface of the supporting plate such that the conductive powder contacts the power supplying terminal;
attaching the mounting plate to the supporting plate via the member which contains the conductive powder; and
heating the mounting plate and the supporting plate under a compressed-atmosphere condition so as to form an inner electrode between the supporting plate and the mounting plate unitarily.

5. A method for manufacturing an electrode-built-in susceptor comprising:
making a green body for a mounting plate for mounting a plate sample thereon and a green body for supporting the mounting plate by a slurry which contains an aluminum-nitride-group-powder;
forming a through hole on the green body for the supporting plate;
sintering the green body;
filling an aluminum-nitride-tantalum-nitride-composite-sintered-member containing 50 to 98 weight percent of tantalum nitride as a power supplying terminal in the through hole;
applying a member which contains a conductive powder on a main surface of the green body for the supporting plate such that the conductive powder contacts the aluminum-nitride-tantalum-nitride-composite-sintered-member;
attaching the green body for the mounting plate to the green body for the supporting plate via the member which contains the conductive powder; and
heating the green body for the mounting plate and the green body for the supporting plate under a compressed-atmosphere condition so as to form an inner electrode between the supporting plate and the mounting plate which are made of an aluminum-nitride-group-sintered-member unitarily, said inner electrode being an aluminum-nitride-tantalum-nitride-composite-sintered-member.

* * * * *